United States Patent
Wurcer et al.

(10) Patent No.: US 6,636,103 B2
(45) Date of Patent: Oct. 21, 2003

(54) AMPLIFIER SYSTEM WITH ON-DEMAND POWER SUPPLY BOOST

(75) Inventors: Scott Wurcer, Cambridge, MA (US); John W. Pierdomenico, Temple, PA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/837,395

(22) Filed: Apr. 18, 2001

(65) Prior Publication Data

US 2002/0153940 A1 Oct. 24, 2002

(51) Int. Cl.[7] .............................. G05F 1/10; G05F 3/02
(52) U.S. Cl. ....................................... 327/536; 327/390
(58) Field of Search ................................. 327/536, 537, 327/589, 390

(56) References Cited

U.S. PATENT DOCUMENTS

| | | | | |
|---|---|---|---|---|
| 5,051,708 A | * | 9/1991 | Boezen et al. ................ 330/11 |
| 5,055,840 A | * | 10/1991 | Bartlett ....................... 250/206 |
| 5,600,551 A | * | 2/1997 | Luscher, Jr. ................. 363/59 |
| 5,812,015 A | * | 9/1998 | Tobita ......................... 327/534 |
| 6,188,274 B1 | * | 2/2001 | Vernon ........................ 327/536 |
| 6,498,521 B1 | | 12/2002 | Bicakci et al. .............. 327/110 |

FOREIGN PATENT DOCUMENTS

DE  2626102 B  * 7/1977 ........... G01R/13/24

* cited by examiner

Primary Examiner—Terry D. Cunningham
Assistant Examiner—Quan Tra
(74) Attorney, Agent, or Firm—Iandiorio & Teska

(57) ABSTRACT

An amplifier system with on-demand power supply boost includes an amplifier circuit for receiving an input signal and a charge pump connected to positive and negative power supplies and having predetermined supply voltages and being responsive to the input signal for increasing beyond the predetermined supply voltages the supply voltage applied to the amplifier in response to an increase in the input signal and a tracking charge pump usable in the amplifier system which includes a charge storage device; a unidirectional isolation device interconnecting the charge storage device and one pole of a power supply; a driver circuit responsive to an input signal and interconnected between both poles of the power supply; the power supply having predetermined power supply voltages; and a bias circuit for biasing the driver circuit to charge the charge storage device in the charge mode and in the boost mode, for increasing beyond the predetermined power supply voltages, the supply voltage supplied by the storage device to an external load in response to an increase in the input signal.

21 Claims, 7 Drawing Sheets

AMPLIFIER SYSTEM WITH ON-DEMAND POWER SUPPLY BOOST

FIELD OF INVENTION

This invention relates to an improved amplifier system with on-demand power supply boost and to a tracking charge pump useful in such a system.

BACKGROUND OF INVENTION

Amplifier efficiency is ratio of power supplied by the amplifier to a load to the power supplied to the amplifier. The crest factor of an applied input signal to an amplifier is the ratio of the peak to RMS levels of that signal. It the crest factor is large enough, the efficiency of the system can be degraded. Further stated: input signals with a generally low RMS value and occasional high peak level cause an amplifier to operate at reduced efficiency. This is so because the power supply is supplying power at a voltage that is at all times sufficient to handle the infrequently occurring peaks and that power is being wasted when the peaks are absent and only the normal RMS levels are present at the input. There are several methods to improve this efficiency. In one approach there are provided a number of power supplies with a steering circuit that adds the current from the second higher potential power supply when the signal exceeds the capacity of the first. This can be extended to third and fourth supplies and beyond. One problem with this approach is that a number of power supplies must be provided. Further, since all of the power supplies have at least a quiescent current operating all the time, the practical efficiency is not greatly improved. Another approach employs the use of a synthesized output impedance in the form of positive feedback. While the efficiency of such a system is improved, the fact that the amplifier is still biased between power supplies substantially greater than the RMS level of the input signal results in less than optimal efficiency. A second approach involves sensing the amplifier's output signal and boosting internal circuitry in a feedback approach. While feasible, this approach can be difficult to implement due to the delay in reacting to the output.

BRIEF SUMMARY OF THE INVENTION

It is therefore an object of this invention to provide an improved tracking charge pump.

It is a further object of this invention to provide such a tracking charge pump which tracks the input to boost the power supply voltage only when needed.

It is a further object of this invention to provide an improved amplifier system with on-demand power supply boost.

It is a further object of this invention to provide such an improved amplifier system with on-demand power supply boost which uses less power and is more efficient.

It is a further object of this invention to provide such an improved amplifier system which requires only one set of power supply voltages.

It is a further object of this invention to provide such an improved amplifier system which avoids unsatisfactory delays.

The invention results from the realization that an improved charge pump for providing a voltage boost to a power supply can be achieved by tracking the input signal and applying a voltage boost from the charge pump only when needed and the further realization that an amplifier system with on-demand power supply boost can be achieved by tracking the input signal and applying a boost voltage from a charge pump to an amplifier only when the input signal level indicates that the normal power supply level will be insufficient.

This invention features a charge pump including a charge storage device and an isolation device interconnecting the charge storage device and one pole of a power supply. A driver circuit is responsive to an input signal and is interconnected between both poles of the power supply. The power supply provides predetermined power supply voltages. A bias circuit biases the driver circuit to charge the charge storage device in the charge mode and in the boost mode increases beyond the predetermined power supply voltages the supply voltage supplied by the storage device to an external load in response to an increase in the input signal. There may be an absolute value circuit responsive to the input signal for delivering the absolute value of the input signal to the charge pump.

In a preferred embodiment, the charge storage device may include a capacitor; the isolation device may include a switch or diode. The driver circuit may include a buffer circuit or transistor. The bias circuit may include a current source or resistor. The external load may include an amplifier and there may be a gain circuit for increasing the voltage applied by the storage device to the amplifier in response to an increase in the input signal as a function of the gain of the amplifier.

This invention also features an amplifier system with an on-demand power supply boost including an amplifier circuit, for receiving an input signal, and a charge pump connected to positive and negative power supplies and having predetermined supply voltages and is responsive to the input signal, for increasing beyond the predetermined supply voltages, the supply voltage applied to the amplifier in response to an increase in the input signal.

In a preferred embodiment, the charge pump may include a tracking charge pump. The tracking charge pump may include a charge storage device and a unidirectional isolation device interconnecting the charge storage device and one pole of the power supply. There may be a driver circuit responsive to an input signal and connected between both poles of the power supply. The power supply may have pre-determined power supply voltages. There may be a bias circuit for biasing the driver circuit to charge the charge storage device in the charge mode, and in the boost mode, for increasing beyond the predetermined power supply voltages, the supply voltage applied by the storage device to an external load in response to an increase in the input signal. There may be an absolute value circuit responsive to input signal for delivering the absolute value of the input signal to the charge pump. There may be a gain circuit for controlling the increase in voltage produced by the charge pump as a function of the gain of the amplifier. There may be a bias circuit for delivering a bias current to the charge pump. There may be a threshold circuit responsive to the input signal exceeding a predetermined threshold for actuating the bias circuit to provide a bias to the charge pump. The bias circuit may provide a bias boost current to the amplifier. There may be delay means for aligning the pump voltage and output signal.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
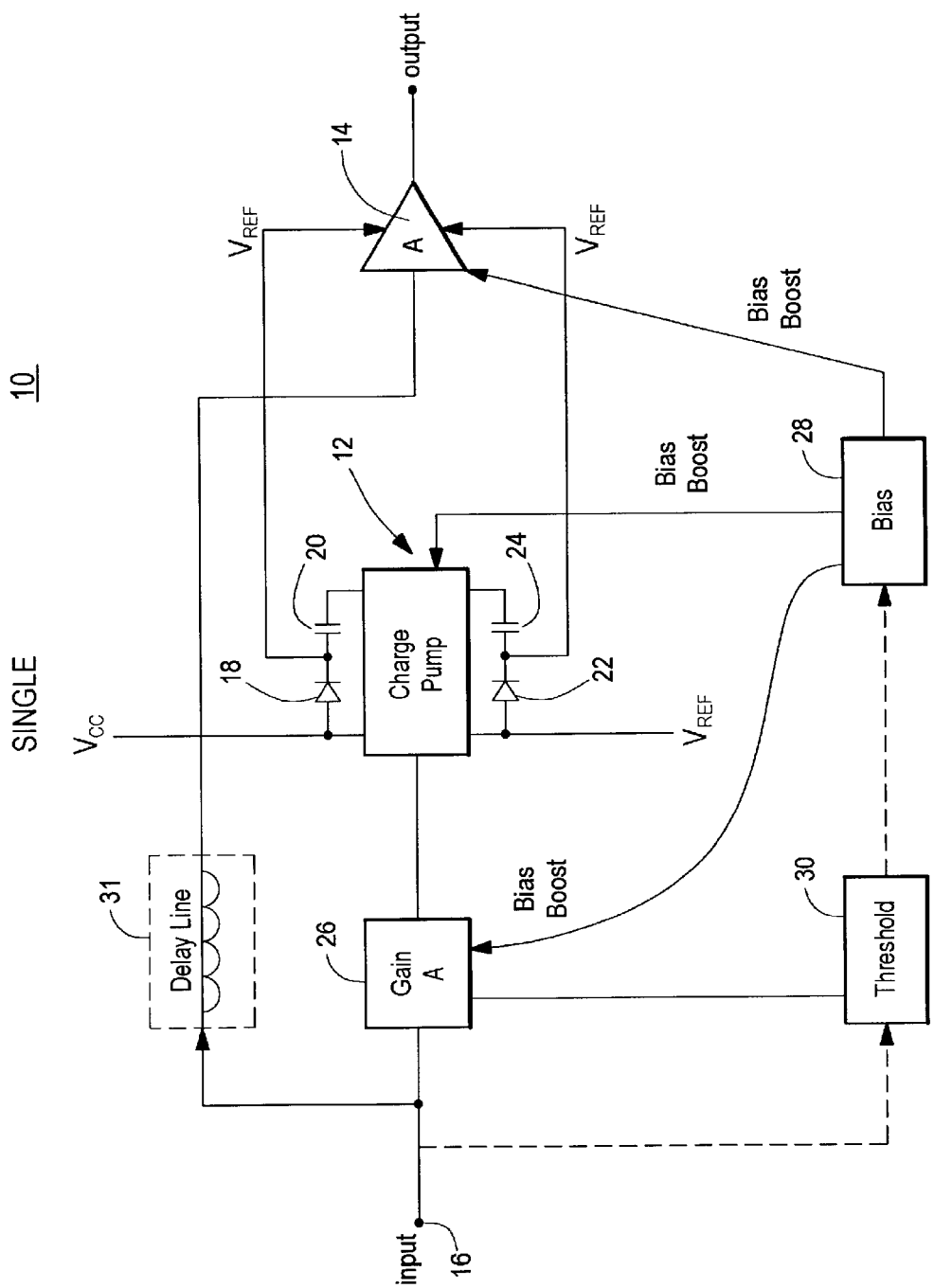
FIG. 1 is a schematic block diagram of a single ended amplifier system with an on-demand power supply boost according to this invention.

There shown in FIG. 1 an amplifier system with on-demand power supply boost 10 which includes a charge pump 12 and an amplifier 14. The circuit shown in FIG. 1 is a single ended type amplifier. Two power supplies $V_{CC}$ and $V_{EE}$ are provided to charge pump 12. $V_{CC}$ may for example, be +6 volts and $V_{EE}$ may be −6 volts. A varying input signal is delivered to input terminal 16. Charge pump 12 includes a diode 18 and a charge storage impedance such as capacitor 20 and a diode 22 and capacitor 24. Capacitor 20 charges through diode 18 and capacitor 24 charges through diode 22. As the input signal on terminal 16 fluctuates, the power supply boost $V_{CCP}$ and $V_{EEP}$ from capacitors 20 and 24, respectively, are provided to amplifier 14 to assure that there is sufficient power supply voltage to accommodate peak signals when necessary on demand and yet keep the voltage supplied on a low level when the signal is operating in its normal range of RMS voltage. This reduces the power required and improves the efficiency of the amplifier. Since this is an amplifier system, the load is in fact amplifier 14 plus whatever external load is connected to it. Since an amplifier can have a gain some adjustment must be made so that when the input signal produces peaks, the voltage provided by capacitors 20 or 24 will be sufficient to provide the necessary supply voltages to amplifier 14 in view of its particular gain. For this purpose, the gain circuit 26 is interconnected between input 16 and charge pump 12. Bias circuit 28 provides the operating bias to gain circuit 26 as well as to charge pump 12 and amplifier 14. In an even more efficient construction a threshold circuit 30 may be used so that bias circuit 28 is only operated when the input signal at terminal 16 exceeds a predetermined value. Below that value, gain circuit 26 and charge pump 12 are not actuated and amplifier 14 can be operating at a lower quiescent point. Then, when the threshold is exceeded, gain circuit 26 and charge pump 12 are activated and amplifier 14 is driven to the higher voltage state.

Figure 2:
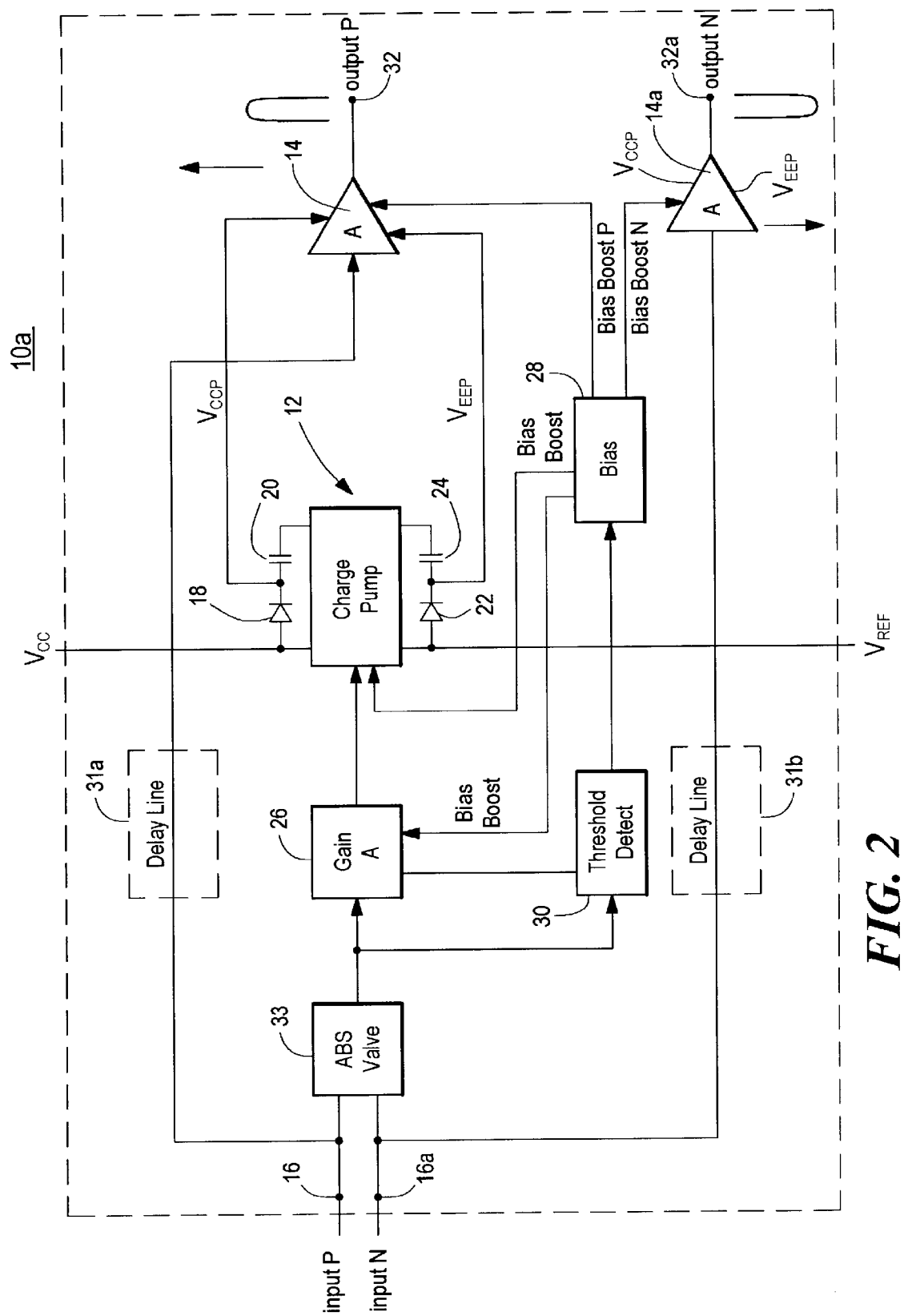
FIG. 2 is a view similar to FIG. 1 for an improved amplifier system with on-demand power supply boost in a differential amplifier application.
Figure 3:
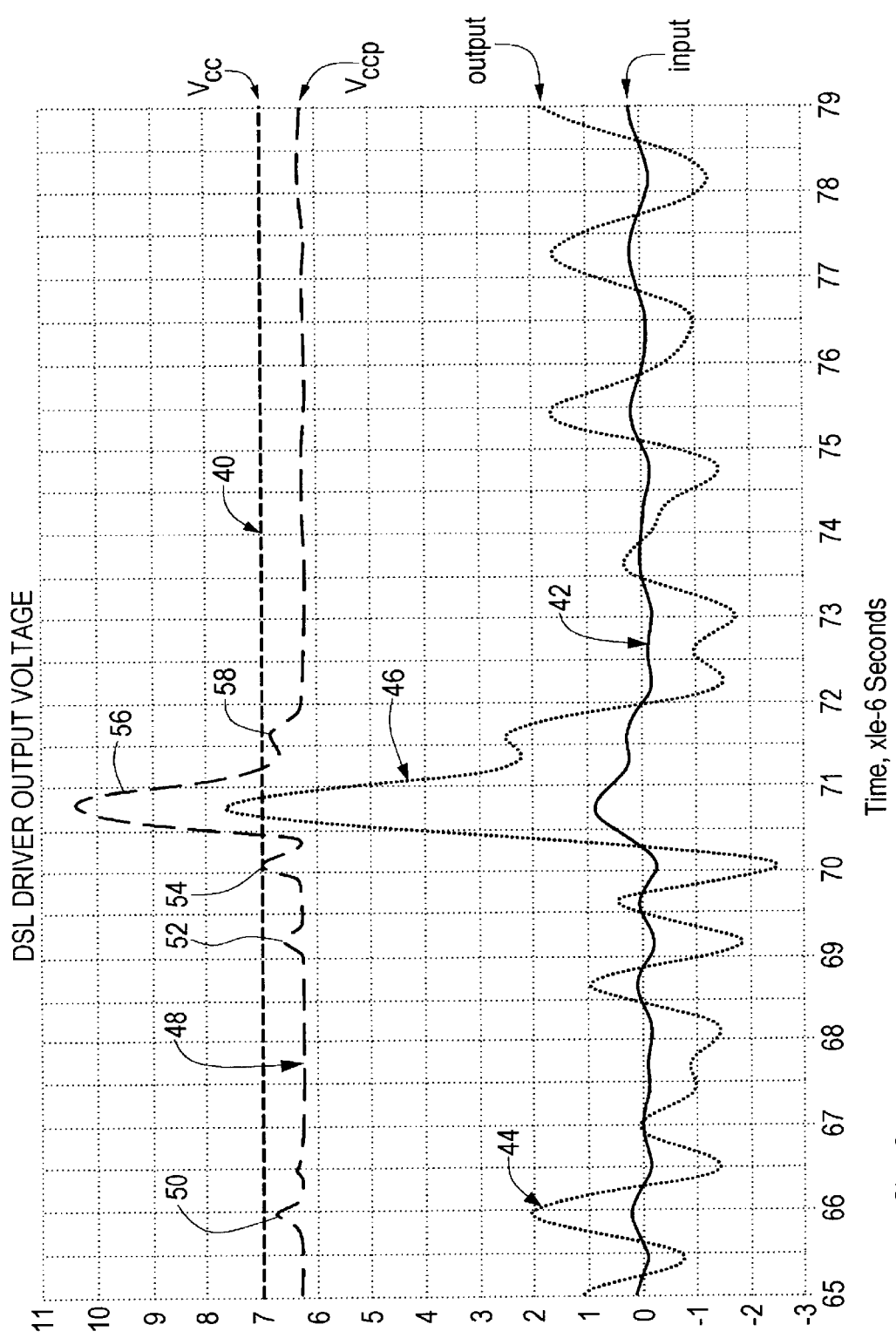
FIG. 3 is a graphical representation showing the power supply boost levels and the input and output signals with thresholding in the device of FIGS. 1 and 2.
Figure 4:
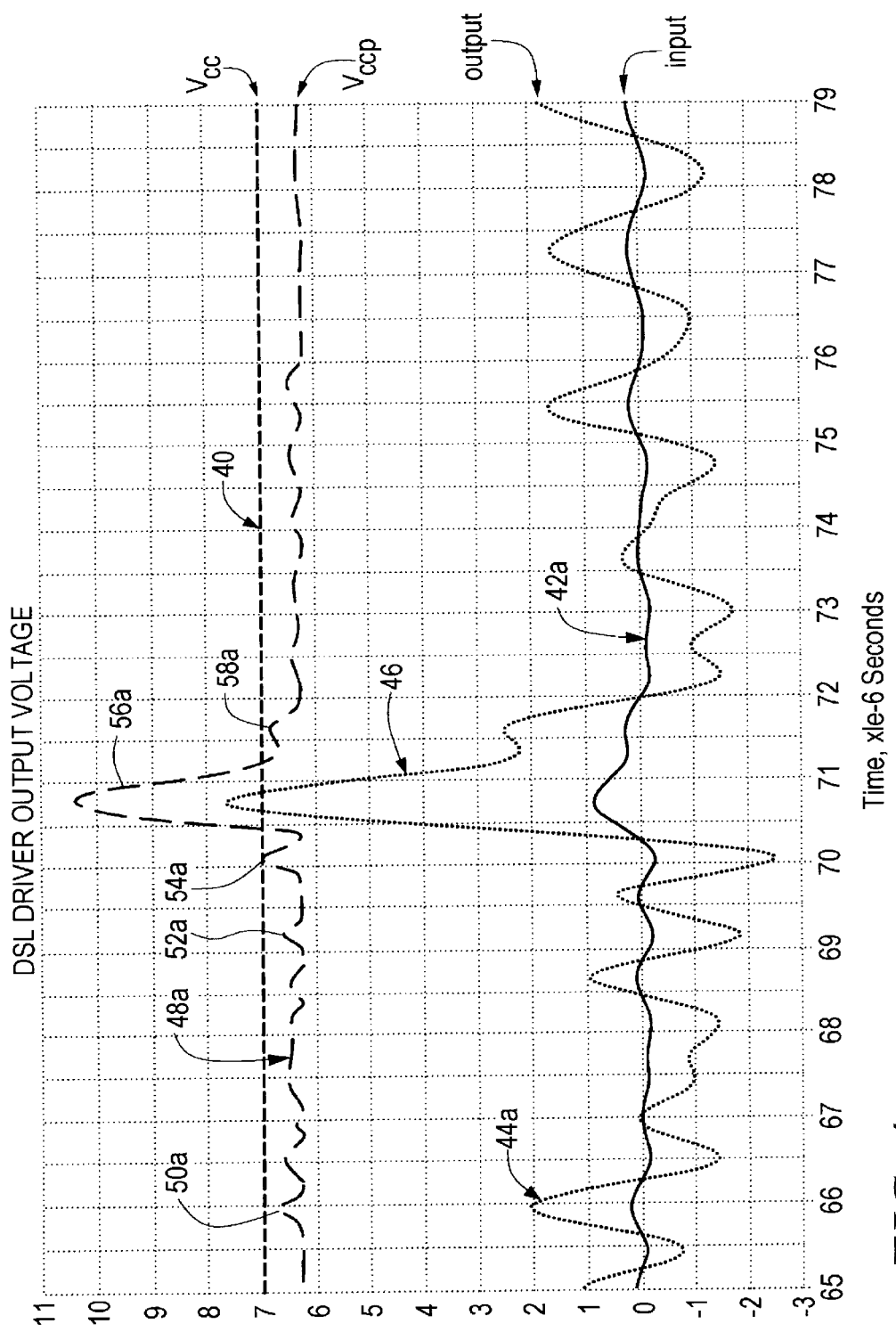
FIG. 4 is a view similar to FIG. 3 without the thresholding.

In accordance with another embodiment, the invention may be applied in a differential circuit, FIG. 2, wherein like parts have given like numbers and similar parts like numbers accompanied by a lower case a. Here, amplifier system 10a includes a second amplifier 14a which receives the same power supply inputs $V_{CCP}$ and $V_{EEP}$ from charge pump 12 as amplifier 14. It also receives its bias from the same bias circuit 28 which may be independent operated or controlled by threshold hold circuit 30. An absolute value circuit 33, such as a rectifier circuit is used to supply on the absolute value of the varying input signal to gain circuit 26. Amplifiers 14 and 14a receive complementary inputs, input p and input n, on terminals 16 and 16a and provide their output p and output n on terminals 32 and 32a. With thresholding, amplifier 10a receives the power supply $V_{CC}$, flat line 40, FIG. 3, and it receives varying input 42. Given the gain 44 of the particular amplifier 18 there would be a number of peaks which would be clipped; they would exceed the capacity of the normal supply voltage $V_{CC}$ such as peak 46 for example. To avoid this, this system, employing threshold circuit 30, causes the tracking charge pump to provide a boost voltage $V_{CCP}$ in excess of the supply voltage but for maximum efficiency it does so only during the times when the input peaks predict that the output peaks will exceed the capacity of the power supply. Thus the charge pump is called upon to provide boosted voltages at 50, 52, 54, 56 and 58 where boost 56 corresponds to peak 46 representing the output with the particular gain of amplifier 14. In this way, the added boost voltage is supplied in order to prevent clipping but without the addition of the second and third or more additional power supplies and the boost is provided only at those times when the peak outputs would overdrive the power supply. The system is still efficient although somewhat less without the threshold circuit 30 as shown in FIG. 4 where $V_{CCP}$ 48a varies continuously in correspondence with the input signal 42a even though it may not be needed to compensate for excessive peaks.

One of the advantages of the amplifier according to this invention is that in selected applications especially the amplification of high crest factor signals it has a theoretical efficiency of at least twice that of class A, B, or AB amplifiers. While conventional class G amplifiers class have higher efficiencies also they require a number of additional power supplies. A delay circuit, e.g., delay line 31, FIG. 1, 31a, 31b, FIG. 2 may be used to delay the signal to the amplifier so that it arrives at amplifier 14 at the same time as the signal from the charge pump. A delay line, or the delay inherent in a filter circuit can optionally be used to improve performance by optimally aligning the pump voltage and the output signal in time.

Figure 5:
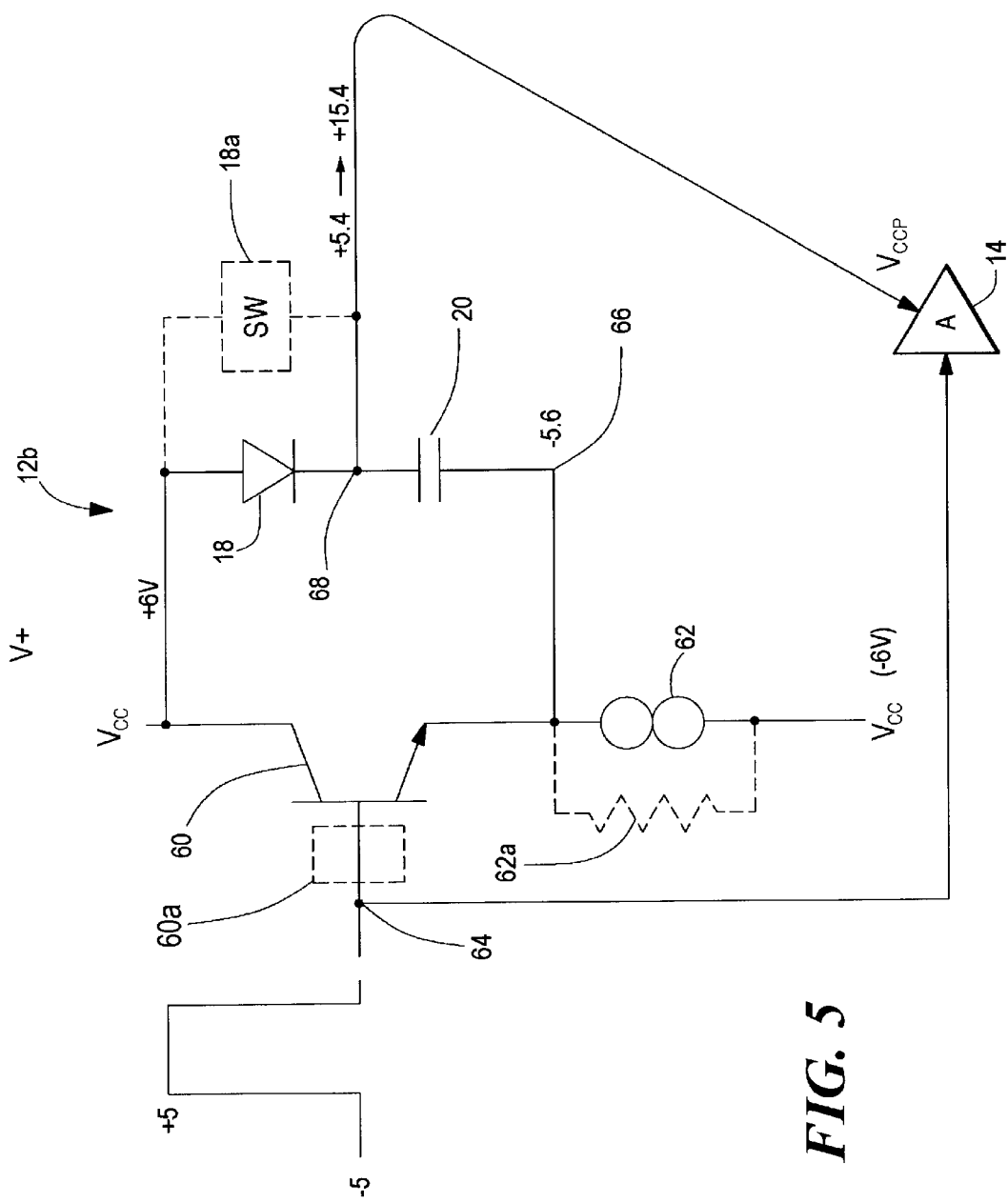
FIG. 5 is a schematic diagram of a single tracking charge pump according to this invention which may be used in the improved amplifier system of this invention.

A tracking charge pump 12b according to this invention which may be used in the amplifier system of FIGS. 1 and 2 is shown in FIG. 5, including diode 18 and capacitor 20. Driver circuit includes a NPN transistor 60 and a biasing circuit, current source 62. In operation with a −5 volt signal at its input terminal 64 the diode drop across the base to emitter junction of transistor 60 produces a voltage on terminal 66 of −5.6 volts that is the −5 volts of the input signal and the junction drop of 0.6 volts. Terminal 68 of capacitor 20 carries a voltage of +5.4 volts derived from the +6 volts of $V_{CC}$ applied to diode 18 minus the diode junction drop of +0.6 volts. Thus the total across capacitor 20 is 11 volts. Assuming by way of example only, an input pulse of 10 volts, that is, one that rises from −5 volts to +5 volts at input terminal 64, the result is a change in voltage on terminal 66 of capacitor 20 from −5.6 volts to +4.4 volts. The additional 10 volts at terminal 68 boosts that voltage from 5.4 volts to +15.4 volts. Terminal 68 provides the boost voltage $V_{CCP}$ which at this point then is 15.4 volts. Thus amplifier 14 is momentarily provided with a power supply voltage of 15.4 volts when and as needed, when in fact, there is only power supply $V_{CC}$ of 6 volts available. A diode is not the only implementation of isolation device 18: it may be any kind of switch, e.g., a transistor. The driver circuit need not be a transistor 60 as shown but could be any type of buffer circuit 60a. The current source 62 is not the only implementation: any voltage controlled current source, e.g., resistor 62a can be used.

Figure 6:
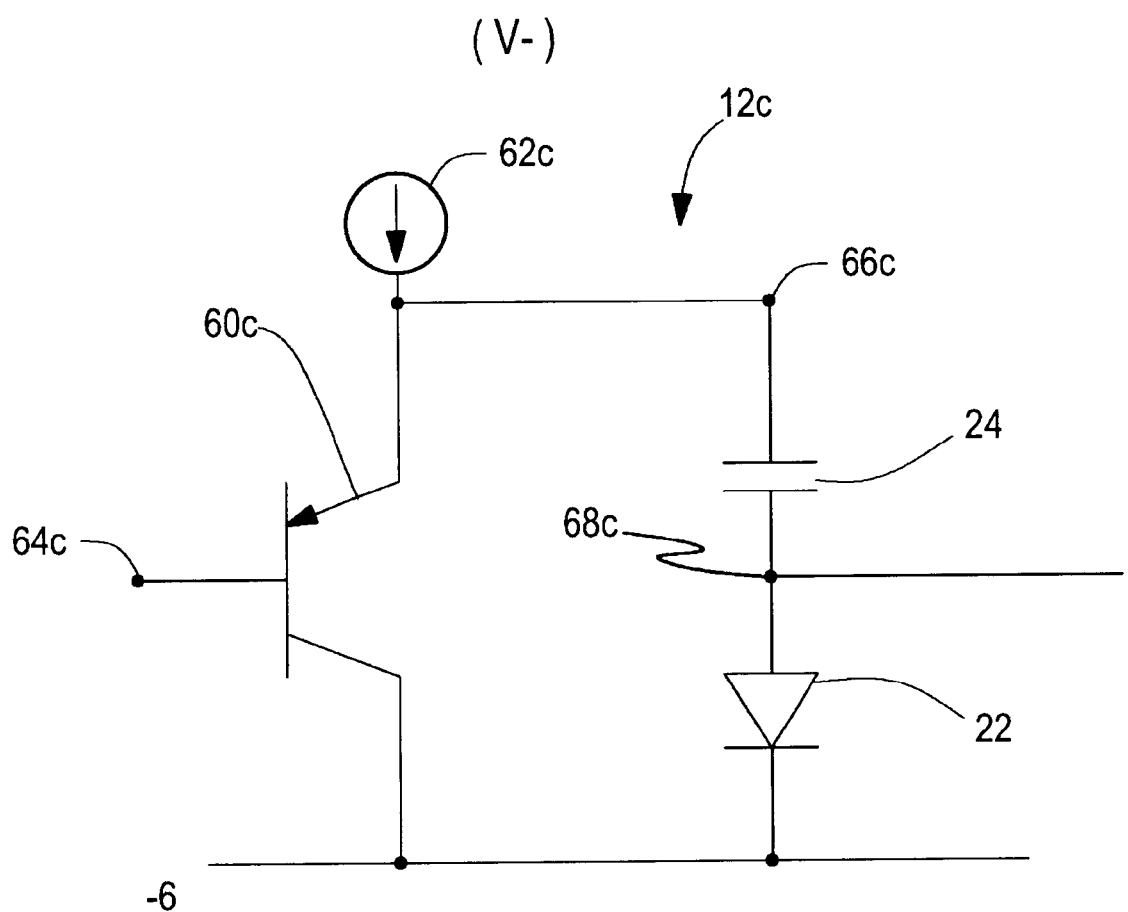
FIG. 6 is a schematic diagram similar to FIG. 5 of a complementary tracking charge pump according to this invention.
Figure 7:
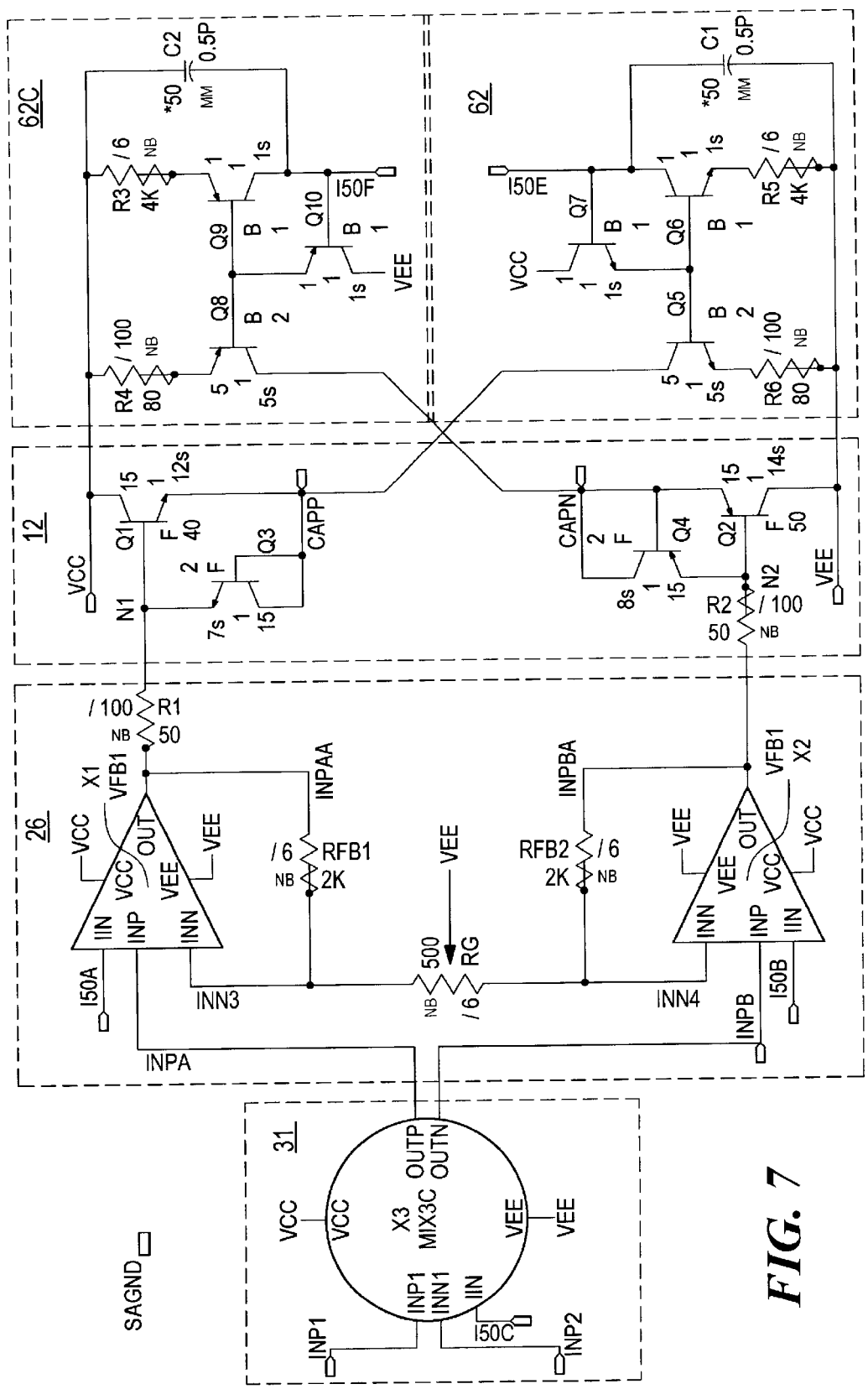
FIG. 7 is a more detailed schematic diagram of a tracking charge pump according to this invention using dual complementary charge pump circuits.

The complementary charge pump 12c, FIG. 6 includes diode 22 and capacitor 24 and is otherwise a mirror image of charge pump 12b with the exception that driver circuit 60c includes a PNP transistor. The tracking charge pump of FIGS. 5 and 6 produces excellent results when used in the amplifiers 10 and 10a of FIGS. 1 and 2 but other charge pumps may be used as well. A more detailed schematic diagram showing component values of the absolute value circuit, gain circuit, charge pump, and biased circuits is shown in FIG. 7.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An amplifier system with on-demand power supply boost comprising:

an amplifier circuit for receiving an input signal; and a charge pump connected to positive and negative power supplies having predetermined supply voltages and being responsive to peaks in said input signal for increasing beyond said predetermined supply voltages, the supply voltage applied to said amplifier in response to an increase in the input signal, wherein said charge pump includes a tracking charge pump, said tracking charge pump includes: a charge storage device; an isolation device interconnecting said charge storage device and one pole of a power supply; a driver circuit responsive to the input signal and connected between both poles of the power supply; said power supply having predetermined power supply voltages; and a bias circuit for biasing said driver circuit to charge said charge storage device in the charge mode and in a boost mode for increasing beyond said predetermined power supply voltages the supply voltage applied by said storage device to an external load response to an increase in the input signal.

2. The amplifier system of claim 1 including an absolute value circuit responsive to said input signal for delivering the absolute value of the input signal to said charge pump.

3. The amplifier system of claim 1 including a gain circuit for controlling the increase in voltage produced by said charge pump as a function of the gain of said amplifier.

4. The amplifier system of claim 1 including a threshold circuit responsive to the input signal exceeding a predetermined threshold for activating said bias circuit to provide a bias to said charge pump.

5. The amplifier system of claim 3 in which said bias circuit provides a bias boost current to said amplifier.

6. The amplifier system of claim 1 including delay means for aligning the pump voltage and an output signal.

7. A tracking charge pump comprising: a charge storage device; an unidirectional isolation device interconnecting said charge storage device and one pole of a power supply; a driver circuit responsive to an input signal and connected between both poles of the power supply; said power supply having predetermined power supply voltages; a bias circuit for biasing said driver circuit to charge said charge storage device in the charge mode and in a boost mode for increasing beyond said predetermined power supply voltages the supply voltage applied by said storage device to an external load in response to an increase in the input signal; and an absolute value circuit responsive to said input signal for delivering the absolute value of the input signal to said charge storage device.

8. An amplifier system with on-demand power supply boost comprising:

an amplifier circuit for receiving an input signal;

a charge pump connected to positive and negative power supplies having predetermined supply voltages and being responsive to said input signal for increasing beyond said predetermined supply voltages, the supply voltage applied to said amplifier in response to an increase in the input signal; and an absolute value circuit responsive to said input signal for delivering the absolute value of the input signal to said charge pump.

9. A tracking charge pump comprising:

a charge storage device;

a unidirectional isolation device interconnecting said charge storage device and one pole of a power supply, said power supply having predetermined power supply voltages;

a linear driver circuit responsive to an input signal and configured to discharge said charge storage device in response to a peak of said analog input signal and configured to linearly boost the supply voltage beyond said predetermined power supply voltages to track said peak and prevent overdriving of an external circuit during the occurrence of said peak of said analog input signal; and a bias circuit configured to charge said charge storage device as a function of the analog input signal.

10. The tracking charge pump of claim 9 which said charge storage device includes a capacitor coupled to said isolation device.

11. The tracking charge pump of claim 9 in which said isolation device includes a switch interconnecting said charge storage device and the one pole of the power supply.

12. The tracking pump of claim 9 which said isolation device includes a diode interconnecting paid charge storage device and the one pole of the power supply.

13. The tracking charge pump of claim 9 in which said driver circuit includes a buffer circuit coupled to said charge storage device.

14. The tracking charge pump of claim 9 in which said driver circuit includes a transistor coupled to said charge storage device.

15. The tracking charge pump of claim 9 which said bias circuit includes a voltage controlled current source coupled to the second pole of the power supply.

16. The tracking charge pump of claim 9 in which said bias circuit includes a resistor coupled to the second pole of the power supply.

17. The tracking charge pump of claim 9 in which the external circuit includes an amplifier and the tracking charge pump includes a gain circuit for increasing the voltage applied by the storage device amplifier in response to an increase in the input signal as a function of the gain of the amplifier.

18. The tracking charge pump of claim 9 further including an absolute value circuit responsive to said input signal for delivering the absolute value of the input signal to said charge storage device.

19. The tracking charge pump of claim 1 in which the input signal is an analog signal.

20. The tracking charge pump of claim 1 in which supply voltage continuously varies in correspondence with peaks of the input signal to provide a voltage boost as needed.

21. The tracking charge pump of claim 1 in which the supply voltage is applied to said amplifier in response to an increase in the input signal that would exceed the capacity of the predetermined power supply voltages.

* * * * *